United States Patent
Baruch et al.

(10) Patent No.: US 8,008,935 B1
(45) Date of Patent: Aug. 30, 2011

(54) TESTER AND A METHOD FOR TESTING AN INTEGRATED CIRCUIT

(75) Inventors: Ezra Baruch, Karkur (IL); Dan Kuzmin, Givat-Shmuel (IL); Michael Priel, Hertzlya (IL)

(73) Assignee: Freescale Semiconductor, Inc., Austin, TX (US)

( * ) Notice: Subject to any disclaimer, the term of this patent is extended or adjusted under 35 U.S.C. 154(b) by 1021 days.

(21) Appl. No.: 11/753,003

(22) Filed: May 24, 2007

(51) Int. Cl.
*G01R 31/3187* (2006.01)

(52) U.S. Cl. .................................. 324/750.3

(58) Field of Classification Search .................. None
See application file for complete search history.

(56) References Cited

U.S. PATENT DOCUMENTS

| | | | | |
|---|---|---|---|---|
| 6,384,655 | B1 * | 5/2002 | Mullarkey | 327/276 |
| 7,412,343 | B2 * | 8/2008 | Stroud et al. | 702/120 |
| 2005/0111537 | A1 | 5/2005 | Sunter et al. | |

\* cited by examiner

*Primary Examiner* — Vinh P Nguyen

(57) ABSTRACT

A method for testing an integrated circuit, that includes: (a) providing a first signal to a first path that starts within the integrated circuit and ends at a first memory element that is followed by a first IO pad, and providing a second signal to a second path that starts within the integrated circuit and ends at a second memory element that is followed by a second IO pad; (b) comparing between a first test result and a second test result, wherein the first test result represents a state of the first memory element sampled a predefined period after a provision of the first signal and the second test result represents a state of the second memory element sampled a predefined period after a provision of the second signal; (c) altering the predefined period; and (d) repeating the stages of providing, comparing and altering until detecting a time difference between a first path propagation period and a second path propagation period.

21 Claims, 5 Drawing Sheets

TESTER AND A METHOD FOR TESTING AN INTEGRATED CIRCUIT

FIELD OF THE INVENTION

The invention relates to methods and systems for testing an integrated circuit.

BACKGROUND OF THE INVENTION

Integrated circuits interface with their surrounding by input/output (IO) pads that can exchange IO signals. The testing of IO signals and especially their alternate current (AC) characterization is complex. The design of accurate tests and testers for measuring the AC characteristics of IO signals can last months and even years. Setup/hold/skew time between different I/O signals is not simple for measuring on the tester and requires complicated functional tests with strict synchronization solutions.

There is a need to provide a tester and method for testing integrated circuits.

SUMMARY OF THE INVENTION

A tester and a method for testing an integrated circuit as described in the accompanying claims.

BRIEF DESCRIPTION OF THE DRAWINGS

The foregoing and other objects, features, and advantages of the present invention will become more apparent from the following detailed description when taken in conjunction with the accompanying drawings. In the drawings, similar reference characters denote similar elements throughout the different views, in which.

DETAILED DESCRIPTION OF THE DRAWINGS

The tester and testing method benefit from the following assumptions: (i) all IO tests (such as tests defined in IO specifications) can be translated to timing differences between one IO signal to another ideally delayed IO signal (skew measurement) or between one IO signal to a clock signal (setup or hold measurement), and (ii) each path that ends (or starts) at an IO pad includes a first part that starts within the integrated circuit and ends at a memory element that is followed by an IO pad, (iii) measuring the response time of an IO pad is known in the art.

Accordingly, once testing requirements are provided they are converted to a series of tests that test the timing differences between signals that propagate towards different IO pads.

Figure 1:
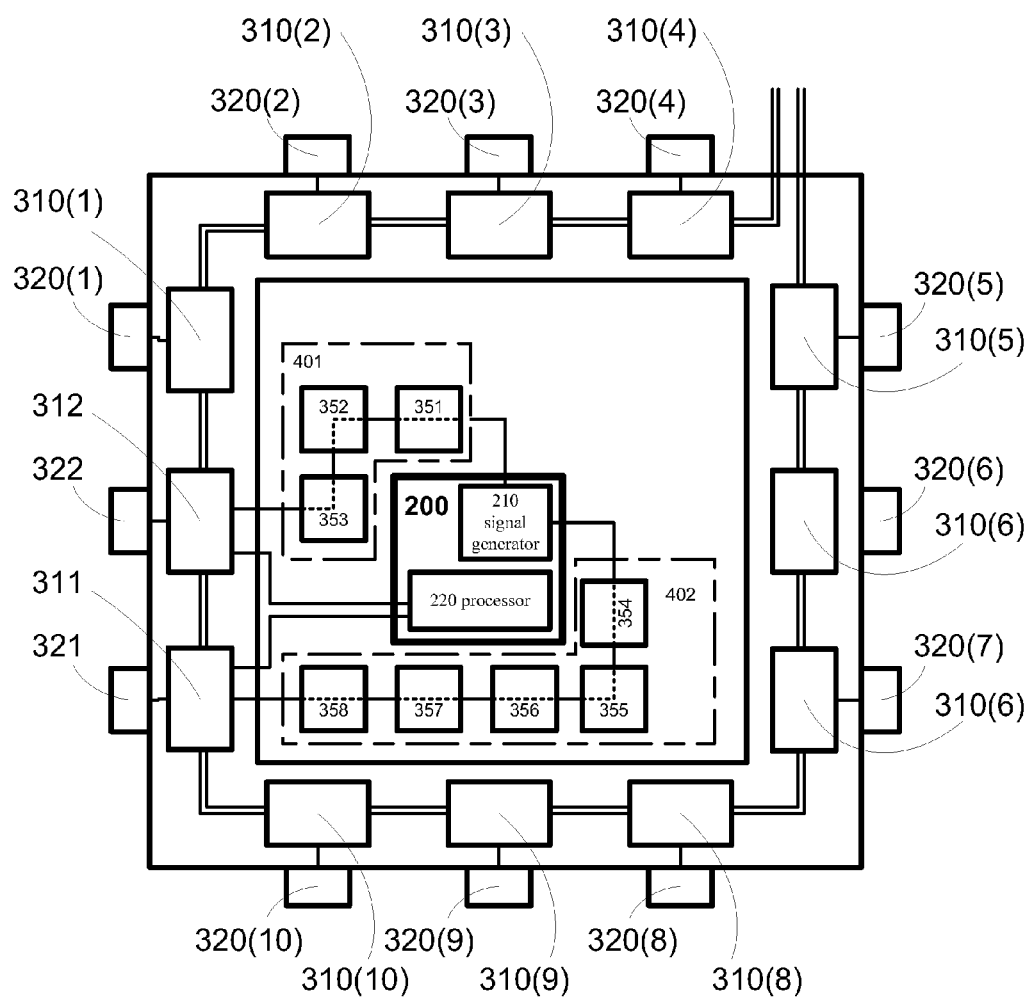
FIG. 1 illustrates an integrated circuit that includes a tester, according to an embodiment of the invention.

FIG. 1 illustrates integrated circuit 300 that includes tester 200, according to an embodiment of the invention. Tester 200 includes signal generator 210, which is adapted to: (a) provide a first signal to first path 401 that starts within integrated circuit 300 and ends at first memory element 311 that is followed by a first IO pad 321. According to the embodiment illustrated in FIG. 1, first path 401 includes flip-flops 351, 352, and 353, and additional logic which is not shown; and (b) provide a second signal to second path 402 that starts within integrated circuit 300 and ends at second memory element 312 that is followed by second IO pad 322. According to the embodiment illustrated in FIG. 1, second path 402 includes flip-flops 354, 355, 356, 357 and 358 and additional logic which is not shown. It is noted that the number of electrical components such as logic gates, switches, flip-flop and latches in each of the first and second path could vary greatly, and that different embodiments of tester 200 are adapted to provide signals to paths of different sizes.

Typically, integrated circuit 300 includes additional electronic components (not illustrated) apart from the electrical components which are included in the first and the second paths. Typically, integrated circuit 300 further includes additional memory elements (such as memory elements 310(1) through 310(10)) which are connected to additional IO pads (such as IO pads 320(1) through 320(10)). It is noted that integrated circuit 300 may include additional components which are not illustrated.

According to an embodiment of the invention, tester 200 is adapted to generate the first and the second signals in response to test information, which includes the first and second signals. According to an embodiment of the invention, tester 200, such as by using signals generator 210, is adapted to store the test information, whereas according to another embodiment of the invention, the test information is stored elsewhere on the integrated circuit which is accessible to signals generator 210. According to an embodiment of the invention, tester 200 is adapted to generate the test information. According to an embodiment of the invention, the test information is compatible to at least one scan chain of integrated circuit 300.

Conveniently, tester 200 is adapted to generate the test information so as to facilitate the provision of the first signal and the second signal, that when provided to first path 401 and to second path 402 of integrated circuit 300 would eventually affect a state of first memory element 311 that is followed by first IO pad 321 and a state of second memory element 312 that is followed by second IO pad 322.

According to an embodiment of the invention, at least one of first path 401 and second path 402 is a functional path of integrated circuit 300, i.e. a path of integrated circuit 300 which is designed to implement a predetermined logic that integrated circuit 300 is designed to carry out. Conveniently, a functional path is selected as one of first path 401 and second path 402 when a time difference between a first path propagation period and a second path propagation period which is to be detected by tester 200 is pertaining to a nominal operation of integrated circuit 300.

According to an embodiment of the invention, at least one of first path 401 and second path 402 is a scan chain (not shown) of integrated circuit 300, i.e. a part of the design for test architecture of integrated circuit 300 in which multiple latches and/or flip-flops are chained into a long shift register. Conveniently, a scan chain is selected as one of first path 401 and second path 402 when the time difference between a first path propagation period and a second path propagation period which is to be detected by tester 200 is pertaining to tests applied to integrated circuit 300.

According to an embodiment of the invention, tester 200, and especially signal generator 210, is adapted to provide the first signal to first path 401 that starts in proximity to the start of second path 402, which is useful, by way of illustrative example only, when the time difference between a first path propagation period and a second path propagation period which is to be detected by tester 200 is pertaining to two paths, wherein both paths starts from a limited area of integrated circuit 300, to first memory element 311 and to second memory element 312 which are followed by first IO pad 321 and second IO pad 322, respectively.

Tester 200 further includes processor 220, which is adapted to detect a time difference between a first path propagation period and a second path propagation period, wherein the first path propagation period pertains to a propagation of the first signal along first path 401, and the second path propagation period pertains to a propagation of the second signal along second path 402.

In order to facilitate the detection of the time difference, processor 220 is adapted to compare between a first test result and a second test result, wherein the first test result represents a state of first memory element 311 which is sampled a predefined period after a provision of the first signal, and the second test result represents a state of second memory element 312 which is sampled concurrently to the sampling of the state of first memory element 311. It is noted that each of the first and the second test results is responsive to the first and the second signals, respectively.

Tester 200 is adapted to alter the predefined period, and to repeat a provision of the first signal and second signal and a comparison of the first test result to the second test result such as to detect a time difference between a first path propagation period and a second path propagation period.

Figure 2:
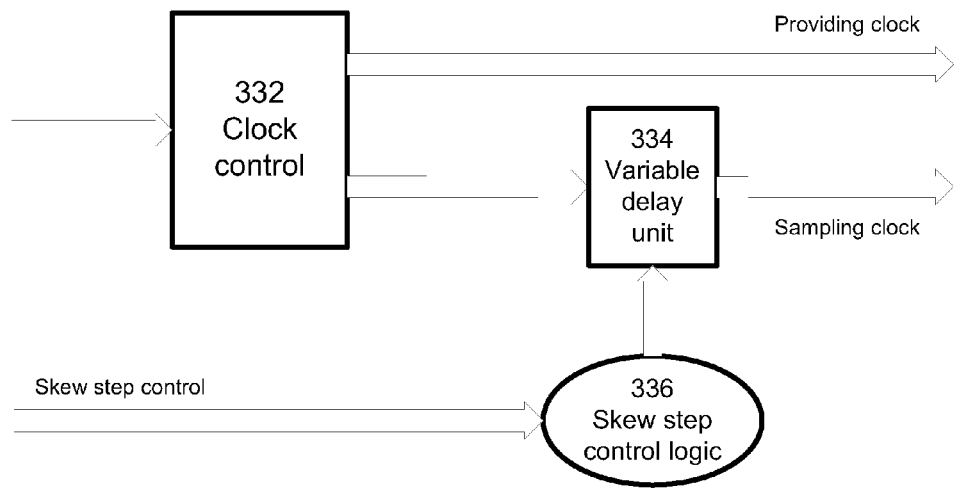
FIG. 2 illustrates a variable delay unit for providing a sampling clock signal and a clock control for providing clock signals, according to an embodiment of the invention.

Referring now to FIG. 2, Conveniently, each of first path 401 and second path 402 receives a providing clock signal, and each of first memory element 311 and second memory element 312 receives a sampling clock signal which is delayed in regard to the providing signal, wherein the sampling clock signal is delayed by the predefined period. According to an embodiment of the invention, the predefined period can be set by variable delay unit 334, which received clock signals from clock control 332. Conveniently, variable delay unit sets the predefined period in response to signals received from skew step control logic 336. According to an embodiment of the invention, variable delay unit includes multiple delay components (not shown) that are connected in a serial manner to provide a multiple-section delay path, and a multiplexer (not shown) that can select which sections of the delay path will participate in delaying the clock signal. The delayed clock signal is used to sample (or trigger a sample of) the state of the first and the second memory elements 311 and 312. It is noted that, according to an embodiment of the invention, variable delay unit 334 is adapted to provide different sampling clocks and/or different providing clocks, in order to counter signal delays of integrated circuit 300.

According to an embodiment of the invention, tester 200 is adapted to calibrate variable delay unit 334 to the specific integrated circuit 300. According to an embodiment of the invention, tester 200 is adapted to calibrate variable delay unit 334 by configuring variable delay unit 334 as a ring oscillator, and by counting a number of cycles in one or more known periods of time.

Referring now back to FIG. 1. As noted before, conveniently when provided by signals generator 210 to first path 401 and to second path 402 respectively, the first and the second signals are adapted to affect the states of first memory element 311 and of second memory element 312 in a similar way, though wherein the state of one memory element differs from the state of the other memory element in a phase shift, i.e. a state of one of the memory elements will be a delayed equivalent of the state of the other memory element, though otherwise similar.

According to an embodiment of the invention, tester 200 is adapted to sample the first and the second test results. According to an embodiment of the invention, processor 220 is further adapted to store the first and the second test results, in order to facilitate the comparison of the test results, as is detailed below. It is noted that according to an embodiment of the invention, at least one of first memory element 311 and second memory element 312 is adapted to store a least one test result. According to another embodiment of the invention, at least one additional memory element (not shown), which is connected to at least one of first memory element 311 and second memory element 312, is adapted to store the at least one test results.

Processor 220 is adapted to compare the first test result to the second test result. It is noted that conveniently, the first and the second test results are Boolean values, which makes a comparison between the first and the second test results a simple, clear unequivocal comparison. It is noted that, according to an embodiment of the invention, processor 220 (or, according to another embodiment of the invention, memory elements 311 and 312) is adapted to process at least one of the first and the second test results into a Boolean value.

In purpose of clarifying the invention, it is noted that, as is well known to any person skilled in the art, that the comparison of two Boolean values can result in either of four results (A equals B equals 1, A equals B equals 1, A equals 1 and B equals 0, and A equals 0 and B equals 1). According to an embodiment of the invention in which the first and the second test results are Boolean values, processor 220 is adapted to determine if the first and the second test results are equal or different, which could be described by the logical exclusive OR operation (conventionally referred to as a XOR operation).

Processor 220 is adapted to carry out multiple instances of comparison of first and second test results; wherein signals generator 210 is further adapted to repeatedly provide first and second signals to first paths 401 and to second path 402.

Tester 200 is adapted to alter the predefined period during at least one of said repetitions of sampling and comparison. It is thus possible to processor 220 to collect a set of results, wherein each results is associated with a predefined period. According to an embodiment of the invention, the set of results includes pairs of results wherein each pair includes a first test result and a second test result that were sampled concurrently, wherein each pair is associated with the predefined period that applied to the sampling of said test results.

According to such an embodiment of the invention, processor 220 is adapted to compare the test results immediately after the sampling. According to an embodiment of the invention, processor 220 is adapted to compare the test results in a later time (e.g. to compare multiple pairs of test results after multiple instances of sampling). According to an embodiment of the invention, the set of results includes the results of the comparing instances, each associated with the relevant predefined period. According to such an embodiment of the invention, the set of results includes Boolean values which resulted from applying an exclusive OR operation as described above, each associated with the relevant predefined period.

According to an embodiment of the invention, tester 200 is adapted to alter the predefined period by a fraction of a clock cycle supplied to at least one path out of first path 401 and second path 402. Conveniently, the set of results thus includes results which are associated to multiple predefined periods, which are parted from each other by fractions of said clock cycle, to provide a high accuracy of the testing carried out by tester 200. It is noted that on many situation, tester 200 is applied for the testing of properties of integrated circuit 300 which are characterized by periods which are shorter, or in the scale of, clock cycles of integrated circuit 300.

Multiple ways of altering the predefined period by a fraction of a clock cycle supplied to at least one path out of first path 401 and second path 402 are known in the literature, and are easily implemented by any person skilled in the art.

According to an embodiment of the invention, tester 200 is further adapted to repeat the provision of first and second signals and a detection of the time difference for different ambient conditions. According to an embodiment of the invention, tester 200 is adapted to test integrated circuit 300 in multiple ambient conditions. According to an embodiment of the invention, tester 200 is further adapted to order a changing of at least one ambient condition in which integrated circuit 300 is situated. It is noted that typically, integrated circuits behave differently in different ambient conditions such as temperature, pressure, humidity and so forth. It is therefore useful on many occasions, to test characteristics of integrated circuit 300 (such as but not limited to the time difference between the first path propagation period and the second path propagation period) in different ambient conditions, examples of some of which were offered above.

Conveniently, tester 200 is adapted to repeat the provision, sampling and comparison sufficiently, to enable processor 220 to detect the time difference between a first path propagation period and a second path propagation period, wherein the first path propagation period pertains to a propagation of the first signal along first path 401, and the second path propagation period pertains to a propagation of the second signal along second path 402. It is noted that processor 220 is adapted to detect the time difference in response to at least a portion of the instances of comparison. According to an embodiment of the invention, processor 220 is adapted to detect the time difference in response to the set of results.

According to an embodiment of the invention, processor 220 is adapted to detect the time difference in response to a length of a period during which the first test result differs from the second test result. As was noted above, conveniently, the first and the second signals, when provided to first path 401 and to second path 402 respectively, are adapted to affect the states of first memory element 311 and of second memory element 312 in a similar way, though wherein the state of one memory element differs from the state of the other memory element in a phase shift, i.e. a state of one of the memory elements will be a delayed equivalent of the state of the other memory element, though otherwise similar.

Figure 3:
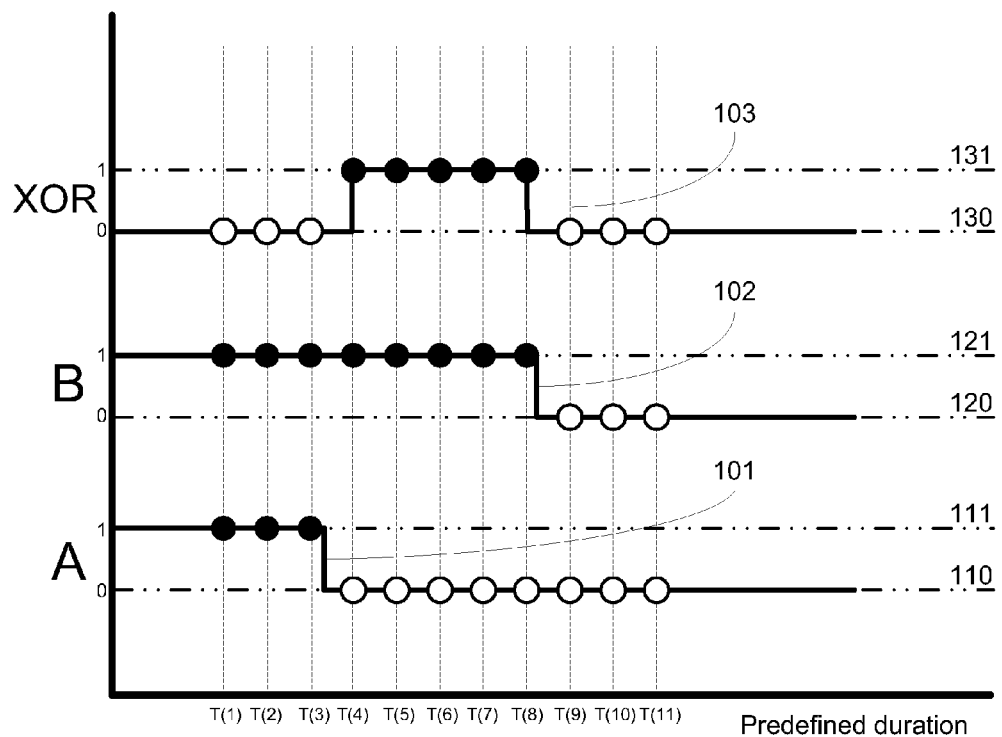
FIG. 3, which illustrates a comparison and a detection of a time difference, according to an embodiment of the invention.

Referring to FIG. 3, which illustrates a comparison and a detection which are carried out by processor 220, according to an embodiment of the invention. It is noted that FIG. 3 illustrates only one way to compare test results and to detect time difference, and that according to other embodiments of the invention, either the comparison, the detection or the way in which the first and the second test results are sampled may differ from those offered by the example offered in FIG. 3.

Curve 101 represents the state of first memory element 311 over a span of predefined durations, wherein each vertical line denoted by T(1) through T(11) represent an actual sampling of memory elements 311 and 312, and wherein each circle over line 101 represents the first test result of the correlated sampling. Dashed line 110 represents a low value of the first test result, which is equivalent to a Boolean value of zero according to an embodiment of the invention, whereas dashed line 111 similarly represents a high value of the first test result, which is equivalent to a Boolean value of one, according to an embodiment of the invention. In order to further illustrate the comparison carried out by processor 220, a high value of the first test result in an actual sampling is denoted by a full circle, whereas a low value of the first test result is denoted by an empty circle.

Equivalently, curve 102 represents the state of second memory element 312 over the span of predefined durations, wherein each circle over curve 102 represents the first test result of the correlated sampling. Dashed line 120 represents a low value of the second test result, which is equivalent to a Boolean value of zero according to an embodiment of the invention, whereas dashed line 121 similarly represents a high value of the second test result, which is equivalent to a Boolean value of one, according to an embodiment of the invention. A high value of the second test result in an actual sampling is denoted by a full circle, whereas a low value of the second test result is denoted by an empty circle.

Curve 102 represents an exclusive OR logical operation which is applied to the pairs of correlating first and second test results, over the span of predefined durations. Dashed line 130 represents an agreement of the first and the second test result, which is equivalent to a Boolean value of zero, whereas dashed line 121 represents disagreement between the first and the second test results, which is equivalent to a Boolean value of one.

It is clear to any person skilled in the art that the signal which is represented by line 102 is a delayed but otherwise similar signal to the signal which is represented by line 101. As noted before, this similarity with the exception of said phase shift delay facilitates, according to an embodiment of the invention, the detection of the time difference.

In the instances of sampling in which the predefined period was equal to those represented by T(1), T(2), and T(3), both of the test results are of high value, and therefore are equal to each other, and the associated comparison values are equal to zero. Likewise, in the instances of sampling in which the predefined period was equal to those represented by T(9), T(10), and T(11), both of the test results are of low value, and therefore are equal to each other, and the associated comparison values are likewise equal to zero.

In the instances of sampling in which the predefined period was equal to those represented by T(4), T(5), T(7), and T(8), the first test results are of low value, whereas the second test results, which are delayed in respect to the first test results, are still of high values. Therefore, the associated comparison values associated with the correlated instances of sampling are equal to one.

As line 101 represent a signal which is responsive to the first path propagation period and line 102 represents a signal which is responsive to the second path propagation period, it is clear to any person skilled in the art that processor 220 is able to detect the time difference between the first path propagation period and the second path propagation period, in response to the length of a period during which the first test result differs from the second test result, which could be assessed by the span of time correlating to the difference between the predetermined periods of the samplings of T(4) and T(8).

It is clear to any person skilled in the art that it is desirable to alter the predefined periods in sufficiently small time steps, as to facilitate as accurate detecting of the time difference as possible. According to an embodiment of the invention, tester 200 is further adapted to alter the predefined period in response to previously sampled test results.

It is noted that in some situations, the first and the second signals which are provided to integrated circuit 300 may be provided by the signals generator in a different clock cycle of the clock signal supplied to at least one path out of first path 401 and second path 402. It is however clear to every person skilled in the art that since the said clock difference is known in advance, processor 220 is capable of detecting the time difference in response to such a clock difference between the first and the second signals.

Referring back to FIG. 1, according to an embodiment of the invention, tester 200 is further adapted to measure a first IO pad propagation period of a signal through first IO pad 321, and to measure a second IO pad propagation period through second IO pad 322. The measuring of the IO pads propagation periods may be useful, for example, to determine a first and a second inclusive propagation periods, each is a total of the correlative path propagation period and to the respective IO pad propagation period, which facilitates an easy utilizing of the time difference detected by tester 200, as conventionally signals of interest which are outputted by integrated circuit 300 are detected in the IO pads (such as IO pads 321, 322, and 320(1) through 320(10)) of integrated circuit 300. According to an embodiment of the invention, processor 220 is further adapted to detect an inclusive time difference, between the first and the second inclusive propagation periods.

According to an embodiment of the invention, tester 200 is adapted to evaluate an IO pad output difference between a timing of an output of the second signal by second IO pad 322 and an output of the first signal by first IO pad 321 in response to: (a) the time difference between the first path propagation period and the second path propagation period, (b) first IO pad propagation period, and (c) second IO pad propagation period.

According to an embodiment of the invention, tester 200 is adapted to detect multiple time differences pertaining to multiple pairs of memory elements (thus also to multiple pairs of the IO pads which follow said memory elements). According to an embodiment of the invention, tester 200 is further adapted to map time differences within a group of IO pads.

Figure 4:
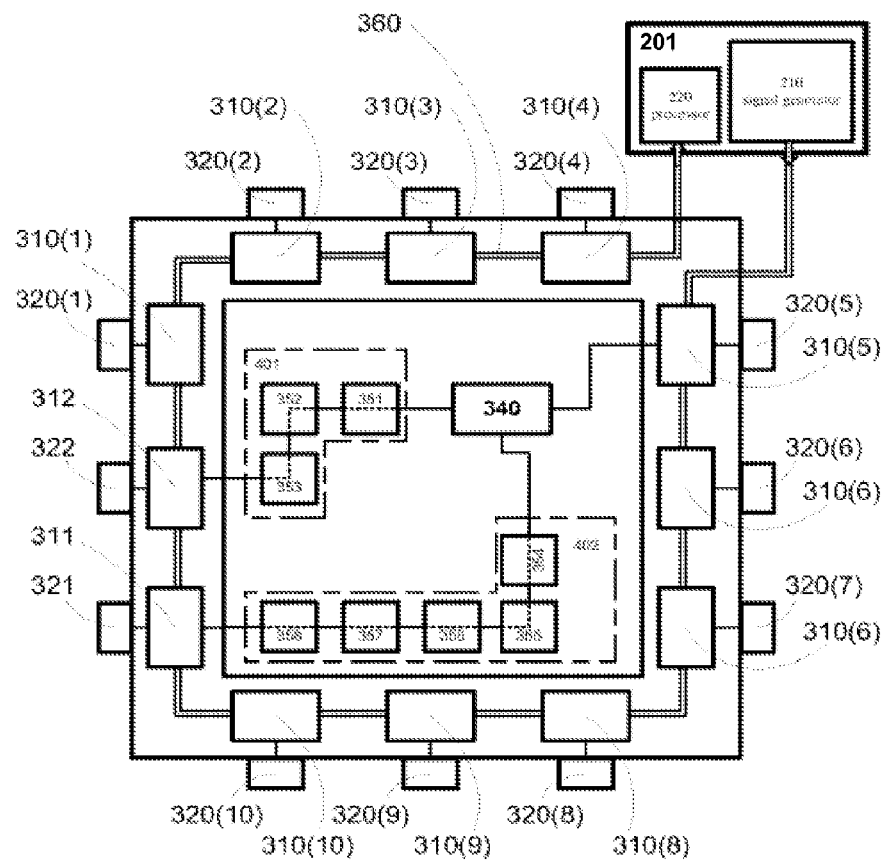
FIG. 4 illustrates a tester for testing an integrated circuit, according to an embodiment of the invention.

FIG. 4 illustrates tester 201 for testing integrated circuit 300, according to an embodiment of the invention. It is noted that tester 201 is similar to tester 200, that different embodiments of tester 201 are capable of the same operations as equivalent embodiments of tester 200. For those reasons, the numeral denoting of components in FIG. 4 is similar to the numeral denoting used in FIG. 1. It is further noted that only some differences between tester 201 and tester 200 are detailed in here, and that referring to the description of FIG. 1 may clarify some aspect hereby detailed.

According to an embodiment of the invention, tester 201 includes additional components (not shown) such as, but not limited to, a stage adapted to hold integrated circuit 300 while being tested.

Tester 201 is external to integrated circuit 300, and includes signal generator 210, which is adapted to: (a) provide a first signal to first path 401 that starts within integrated circuit 300 and ends at first memory element 311 that is followed by a first IO pad 321; and (b) provide a second signal to second path 402 that starts within integrated circuit 300 and ends at second memory element 312 that is followed by second IO pad 322.

According to an embodiment of the invention, tester 201 is adapted to utilize internal signal provider 340 of integrated circuit 300 during the provision of the first and the second signals. According to an embodiment of the invention, signal generator 210 is adapted to order internal signal provider 340 to provide at least one of the first and the second signals to first path 401 or to second path 402, respectively.

According to an embodiment of the invention, tester 201 is adapted to load test information to integrated circuit 300, wherein the test information includes information that used to provide signals in integrated circuit 300. According to an embodiment of the invention, the test information is compatible to at least one scan chain of integrated circuit 300. According to an embodiment of the invention, tester is adapted to load the test information to internal signals provider 340; wherein internal signals provider 340 is adapted to provide at least one of the first and the second signals in response to the test information.

Every person skilled in the art will recognize that many techniques could be used to load the test information to integrated circuit 300. With the intention of clarifying the invention, and by way of example only which is not intended to limit the scope of the invention in any way, two techniques to load the test information are hereby offered.

According to an embodiment of the invention, tester 201 is adapted to load the test information by shifting the test information into a chain (not shown) that includes flip-flops, latches, or combination thereof (such as, but not limited to, a scan chain) which is used as a shift register for the loading of the test information. According to an embodiment of the invention, internal signals provider 340 is included or connected to said chain.

According to an embodiment of the invention, tester 201 is adapted to load the test information to integrated circuit 300 by storing the test information in multiple state retention latches (not shown), or a structure thereof (such as a state retention register, and the like). Conveniently, storing in state retention latches is useful in, though not limited to, integrated circuits which implement state retention power gating. The storing in state retention latches is useful because it facilitates repetitional use of the test information while maintaining low power consumption of storing the test information. According to an embodiment of the invention, internal signals provider 340 includes one or more state retention latches.

According to an embodiment of the invention, tester is adapted to use a boundary scan register 360 of integrated circuit 300, to provide signals to integrated circuit 300, to load the test information to integrated circuit 300, and/or to collect the sampled test results from memory elements such as memory elements 311 and 312.

According to an embodiment of the invention, signals generator 210 is adapted to provide at least one of the first and the second signals to integrated circuit 300 via boundary scan register 340. According to an embodiment of the invention, signals generator 210 is adapted to order internal signals provider 340 via boundary scan register 360.

According to an embodiment of the invention, tester 201 is adapted to collect the sampled test results via boundary scan register 360, and especially via first boundary scan cell (not shown) which is connected to first memory element 311 and a second boundary scan cell (not shown) which is connected to second memory element 312. It is noted that according to an embodiment of the invention which is illustrated in FIG. 4, at least one of first memory element 311 and second memory element 312 can also perform as a boundary scan cell. The first and the second boundary scan cells are included in boundary scan register 360, which facilitates the collecting of signals from memory element (such as memory elements 311, 312, and 310(1) through 310(10)) of integrated circuit 300 that are connected to at least a portion of the IO pads (such as IO pads 321, 322 and 320(1) through 320(10)) of integrated circuit 300.

According to an embodiment of the invention, tester 201 is connected to at least one test access point (TAP) and/or to at least one test access point controller (TAP controller), which are defined by the joint test action group (JTAG) standard for the implementation of boundary scan registers, in order to facilitate the use of boundary scan register 360. It is noted that said connection includes a physical connection as well as JTAG standard data and orders communications.

According to an embodiment of the invention, tester 201 is adapted to repeat the provision of first and second signals and a detection of the time difference for different ambient conditions. According to an embodiment of the invention, tester 201 is further adapted to order a changing of at least one ambient condition in which integrated circuit 300 is situated. According to an embodiment of the invention, tester 201 includes one or more ambient condition controller (not shown), which is adapted to monitor and/or to change at least one ambient condition in which integrated circuit 300 is situated. It is noted that typically, integrated circuits behave differently in different ambient conditions such as temperature, pressure, humidity and so forth. It is therefore useful on many occasions, to test characteristics of integrated circuit 300 (such as but not limited to the time difference between the first path propagation period and the second path propagation period) in different ambient conditions, examples of some of which were offered above.

It is noted that according to some embodiments of the invention, the tester incorporates some components that are external to integrated circuit 300, and some components that are implemented to integrated circuit 300.

Figure 5:
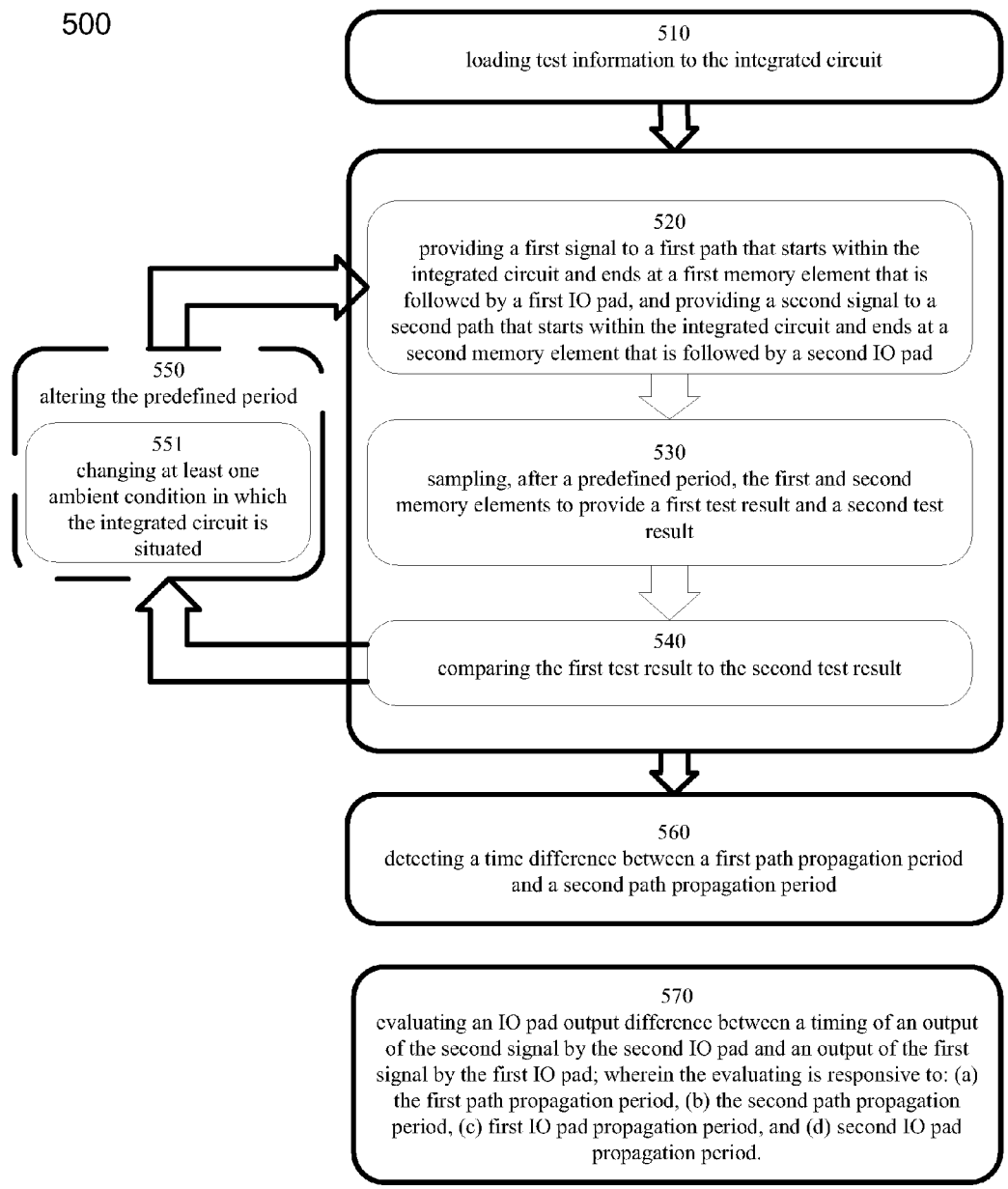
FIG. 5 illustrates method 500 for testing an integrated circuit, according to an embodiment of the invention.

FIG. 5 illustrates method 500 for testing an integrated circuit, according to an embodiment of the invention. Conveniently, method 500 is carried out during a designing of the integrated circuit, during a manufacturing of the integrated circuit. It is noted that method 500 is suitable for testing the integrated circuits in many other situations in addition to the situations herein offered, and that the situations offered where suggested as examples only, with the intention of clarifying the invention by way of illustration.

According to an embodiment of the invention, method 500 starts with stage 510 of loading test information to the integrated circuit, wherein the test information includes information that used will be in a later stage of method 500 to provide signals in the integrated circuit. According to an embodiment of the invention, the test information is compatible to at least one scan chain of the integrated circuit.

Conveniently, stage 510 further includes generating the test information so as to facilitate the providing of two signals, a first signal and a second signal, that when provided to two paths of the integrated circuit would eventually affect the states of the first and the second memory elements in a similar way, though wherein the state of one memory element differs from the state of the other memory element in a phase shift, i.e. a state of one of the memory elements will be a delayed equivalent of the state of the other memory element, though otherwise similar.

Every person skilled in the art will recognize that many techniques could be used for the loading of the test information to the integrated circuit. With the intention of clarifying the invention, and by way of example only which is not intended to limit the scope of the invention in any way, two techniques for the loading of the test information are hereby offered.

According to an embodiment of the invention, the loading of the test information includes shifting the test information into a chain that includes flip-flops, latches, or combination thereof (such as, but not limited to, a scan chain) which is used as a shift register for the loading of the test information.

According to an embodiment of the invention, the loading of the test information to the integrated circuits includes storing the test information in multiple state retention latches, or a structure thereof (such as a state retention register, and the like). Conveniently, the storing in state retention latches is useful in, though not limited to, integrated circuits which implement state retention power gating. The storing in state retention latches is useful because it facilitates repetitional use of the test information while maintaining low power consumption of storing the test information.

Referring to the examples set forward in the previous drawings, stage 510 is carried out by tester 201, and, according to an embodiment of the invention, by signals generator 210 of tester 201.

Stage 510 is followed by stage 520 of providing a first signal to a first path that starts within the integrated circuit and ends at a first memory element that is followed by a first IO pad, and providing a second signal to a second path that starts within the integrated circuit and ends at a second memory element that is followed by a second IO pad. Conveniently, the first and the second signals are responsive to the test information. It is noted that according to an embodiment of the invention, method 500 starts with stage 520. According to an embodiment of the invention in which method 500 starts with stage 520, the test information is already stored in the integrated circuit. According to an embodiment of the invention in which method 500 starts with stage 520, the first and the second signals are provided by a tester which is external to the integrated circuit.

According to an embodiment of the invention, at least one of the first and the second paths is a functional path of the integrated circuit, i.e. a path of the integrated circuit which is designed to implement a predetermined logic that the integrated circuit is designed to carry out. Conveniently, a functional path is selected as one of the first and the second path when a time difference between a first path propagation period and a second path propagation period which is to be detected during method 500 is pertaining to a nominal operation of the integrated circuit.

According to an embodiment of the invention, at least one of the first and the second paths is a scan chain of the integrated circuit, i.e. a part of the design for test architecture of the integrated circuit in which multiple latches and/or flip-flops are chained into a long shift register. Conveniently, a scan chain is selected as one of the first and the second path when the time difference between a first path propagation period and a second path propagation period which is to be detected during method 500 is pertaining to tests applied to the integrated circuit.

According to an embodiment of the invention, the providing includes providing the first signal to the first path that starts in proximity to the start of the second path, which is useful, by way of illustrative example only, when the time difference between a first path propagation period and a second path propagation period which is to be detected during method 500 is pertaining to two paths, wherein both paths starts from a limited area of the integrated circuit, to the first and the second memory elements which are followed by the first IO pad and the second IO pad, respectively.

Referring to the examples set forward in the previous drawings, stage 520 is carried out by signals generator 210.

According to an embodiment of the invention, stage 520 is followed by stage 530 of sampling, after a predefined period, the first and second memory elements to provide a first test result and a second test result; wherein the first test result represents a state of the first memory element sampled a predefined period after a provision of the first signal and the second test result represents a state of the second memory element sampled a predefined period after a provision of the second signal. It is noted that each of the first and the second test results is responsive to the first and the second signals, respectively.

Conveniently, the first and the second signals, when provided to the first and to the second paths respectively, are adapted to lead to the conveniently when provided by signals generator 210 to first path 401 and to second path 402 respectively, the first and the second signals are adapted to affect the states of the first and second memory elements in a similar way, though wherein the state of one memory element differs from the state of the other memory element in a phase shift, i.e. a state of one of the memory elements will be a delayed equivalent of the state of the other memory element, though otherwise similar.

It is noted that conveniently, stage 530 includes storing the first and the second test results until a comparing of stage 540, which is described below. According to an embodiment of the invention, the storing is carried out by the first and the second memory elements. According to another embodiment of the invention, the storing is carried out by at least one additional memory element, which is connected to at least one of the first and the second memory elements.

Conveniently, stage 530 includes collecting the sampled test results via a boundary scan register, and especially via a first boundary scan cell which is connected to the first memory element and a second boundary scan cell which is connected to the second memory element. It is noted that according to an embodiment of the invention, at least one of the first and second memory element can also perform as a boundary scan cell. The first and the second boundary scan cells are included in a boundary scan register, which facilitates the collecting of signals from memory element of the integrated circuit that are connected to at least a portion of the IO pads of the integrated circuit.

Stage 530 is followed by stage 540 of comparing the first test result to the second test result. It is noted that conveniently, the first and the second test results are Boolean values, which makes the comparing a simple, clear unequivocal comparing. It is noted that according to an embodiment of the invention, either stage 530 or stage 540 includes processing at least one of the first and the second test results into a Boolean value. In purpose of clarifying the invention, it is noted that, as is well known to any person skilled in the art, that the comparing of two Boolean values can result in either of four results (A equals B equals 1, A equals B equals 1, A equals 1 and B equals 0, and A equals 0 and B equals 1). According to an embodiment of the invention in which the first and the second test results are Boolean values, the comparing includes determining if the first and the second test results are equal or different, which could be described by the logical exclusive OR operation (conventionally referred to as a XOR operation).

According to an embodiment of the invention, the comparing includes comparing the first test result to the second test result by a tester that is connected to the integrated circuit.

Referring to the examples set forward in the previous drawings, stage 540 is carried out by processor 220.

Method 500 includes repeating the stages of providing, sampling, and comparing, wherein at least one repetition of the stages of providing, sampling and comparing is preceded by stage 550 of altering the predefined period. The repeating facilitates collecting a set of results, wherein each results is associated with a predefined period. According to an embodiment of the invention, the set of results includes pairs of results wherein each pair includes a first test result and a second test result that were sampled concurrently, wherein each pair is associated with the predefined period that applied to the sampling of said test results. According to such an embodiment of the invention, at least some occurrences of comparing are not carried out immediately after the relevant sampling, but in a later time (e.g. according to embodiments of the invention that includes a stage of comparing that follows the repeating, and includes all of the comparing instances). According to an embodiment of the invention, the set of results includes the results of the comparing instances, each associated with the relevant predefined period. According to such an embodiment of the invention, the set of results includes Boolean values which resulted from applying an exclusive OR operation as described above, each associated with the relevant predefined period.

According to an embodiment of the invention, stage 550 includes altering the predefined period by a fraction of a clock cycle which is supplied to at least one path out of the first path and the second path. Conveniently, the set of results thus includes results which are associated to multiple predefined periods, which are parted from each other by fractions of said clock cycle, to provide a high accuracy of the testing of method 500. It is noted that on many situation, method 500 is applied for the testing of properties of the integrated circuit which are characterized by periods which are shorter, or in the scale of, clock cycles of the integrated circuit.

Multiple ways of altering the predefined period by a fraction of a clock cycle which is supplied to at least one path out of the first path and the second path are known in the literature, and are easily implemented by any person skilled in the art.

According to an embodiment of the invention, stage 550 includes repeating the providing, comparing, altering, and detecting stages for different ambient conditions. According to an embodiment of the invention, stage 550 includes stage 551 of changing a ambient condition in which the integrated circuit is situated. It is noted that typically, integrated circuits behave differently in different ambient conditions such as temperature, pressure, humidity and so forth. It is therefore useful on many occasions, to test characteristics of the integrated circuit (such as but not limited to the time difference between the first path propagation period and the second path propagation period) in different ambient conditions, examples of some of which were offered above.

Conveniently, the stages of providing, sampling and comparing are repeated sufficiently, to enable stage 560 of detecting a time difference between a first path propagation period and a second path propagation period, wherein the first path propagation period pertains to a propagation of the first signal along the first path, and the second path propagation period pertains to a propagation of the second signal along the second path. The detecting is responsive to at least a portion of the instances of comparing. According to an embodiment of the invention, the detecting is responsive to the set of results.

According to an embodiment of the invention, the determining is responsive to a length of a period during which the first test result differs from the second test result. As was noted above, conveniently, the first and the second signals, when provided to the first and to the second path respectively, are adapted to affect the states of the first and the second memory elements in a similar way, though wherein the state of one memory element differs from the state of the other memory element in a phase shift, i.e. a state of one of the memory elements will be a delayed equivalent of the state of the other memory element, though otherwise similar.

Referring to FIG. 3, which illustrates the stages of comparing and detecting, according to an embodiment of the invention. It is noted that FIG. 3 illustrates only one way of comparing and of detecting the time difference, and that according to other embodiments of the invention, either the comparing, the detecting or the way in which the first and the second test results are sampled may differ from those offered by the example offered in FIG. 3.

Curve 101 represents the state of the first memory element over a span of predefined durations, wherein each vertical line denoted by T(1) through T(11) represent an actual sampling of memory elements 311 and 312, and wherein each circle over Curve 101 represents the first test result of the correlated sampling. Dashed line 110 represents a low value of the first test result, which is equivalent to a Boolean value of zero according to an embodiment of the invention, whereas dashed line 111 similarly represents a high value of the first test result, which is equivalent to a Boolean value of one, according to an embodiment of the invention. In order to further illustrate the comparison carried out by processor 220, a high value of the first test result in an actual sampling is denoted by a full circle, whereas a low value of the first test result is denoted by an empty circle.

Equivalently, Curve 102 represents the state of the second memory element over the span of predefined durations, wherein each circle over line 102 represents the first test result of the correlated sampling. Dashed line 120 represents a low value of the second test result, which is equivalent to a Boolean value of zero according to an embodiment of the invention, whereas dashed line 121 similarly represents a high value of the second test result, which is equivalent to a Boolean value of one, according to an embodiment of the invention. A high value of the second test result in an actual sampling is denoted by a full circle, whereas a low value of the second test result is denoted by an empty circle.

Curve 102 represents an exclusive OR logical operation which is applied to the pairs of correlating first and second test results, over the span of predefined durations. Dashed line 130 represents an agreement of the first and the second test result, which is equivalent to a Boolean value of zero, whereas dashed line 121 represents disagreement between the first and the second test results, which is equivalent to a Boolean value of one.

It is clear to any person skilled in the art that the signal which is represented by Curve 102 is a delayed but otherwise similar signal to the signal which is represented by Curve 101. As noted before, this similarity with the exception of said phase shift delay facilitates, according to an embodiment of the invention, the detection of the time difference.

In the instances of sampling in which the predefined period was equal to those represented by T(1), T(2), and T(3), both of the test results are of high value, and therefore are equal to each other, and the associated comparison values are equal to zero. Likewise, in the instances of sampling in which the predefined period was equal to those represented by T(9), T(10), and T(11), both of the test results are of low value, and therefore are equal to each other, and the associated comparison values are likewise equal to zero.

In the instances of sampling in which the predefined period was equal to those represented by T(4), T(5), T(7), and T(8), the first test results are of low value, whereas the second test results, which are delayed in respect to the first test results, are still of high values. Therefore, the associated comparison values associated with the correlated instances of sampling are equal to one.

As Curve 101 represent a signal which is responsive to the first path propagation period and Curve 102 represents a signal which is responsive to the second path propagation period, it is clear to any person skilled in the art that processor 220 is able to detect the time difference between the first path propagation period and the second path propagation period, in response to the disagreement period, which could be assessed by the span of time correlating to the difference between the predetermined periods of the samplings of T(4) and T(8).

It is clear to any person skilled in the art that it is desirable that the altering will include altering the predefined periods in sufficiently small time steps, as to facilitate as accurate detecting of the time difference as possible. According to an embodiment of the invention, the altering further includes altering the predefined period in response to previously sampled test results.

It is noted that in some situations, the first and the second signals which are provided to the integrated circuit during the providing may be provided in a different clock cycle of the clock signal which is supplied to at least one path out of the first path and the second path. It is however clear to every person skilled in the art that since the said clock difference is known in advance, according to an embodiment of the invention, the detecting is responsive to such a clock difference between the first and the second signals.

It is noted that the different embodiments of the invention implement different ways of providing, sampling, comparing, altering and detecting. It is further noted that conveniently, the providing, sampling, comparing and altering stages are all carried out in response to the way the detecting is carried out. Likewise, some or all of these stages are conveniently carried out in a way which is responsive to the way at least one of the other stages of method 500 is carried out.

According to an embodiment of the invention, the detecting includes detecting the time difference by a tester that is connected to the integrated circuit.

According to an embodiment of the invention, method 500 includes stage 570 of evaluating an IO pad output difference between a timing of an output of the second signal by the second IO pad and an output of the first signal by the first 10 pad; wherein the evaluating is responsive to: (a) the time difference between the first path propagation period and the second path propagation period, (b) first IO pad propagation period, and (c) second IO pad propagation period.

According to an embodiment of the invention, method 500 includes measuring a first IO pad propagation period of a signal through the first IO pad, and measuring a second IO pad propagation period through the second IO pad. The measuring of the IO pads propagation periods may be useful, for example, to determine a first and a second inclusive propagation periods, each is a total of the correlative path propagation period and to the respective IO pad propagation period, which facilitates an easy utilizing of the time difference detected during the detecting, as conventionally signals of interest which are outputted by the integrated circuit are detected in the IO pads of the integrated circuit.

According to an embodiment of the invention, method 500 further includes detecting an inclusive time difference, between the first and the second inclusive propagation periods.

According to an embodiment of the invention, method 500 includes detecting multiple time differences pertaining to multiple pairs of memory elements (thus also to multiple pairs of the IO pads which follow said memory elements).

According to an embodiment of the invention, method 500 further includes mapping time differences within a group of IO pads.

According to different embodiments of the invention, the different stages are carried out by a tester that is implemented into the integrated circuit, by a tester that is connected to the integrated circuit, by different parts of the integrated circuit, or by combination thereof.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A tester for testing an integrated circuit, the tester comprises:
   a signal generator, adapted to: (a) provide a first signal to a first path that starts within the integrated circuit and ends at a first memory element that is followed by a first IO pad; (b) provide a second signal to a second path that starts within the integrated circuit and ends at a second memory element that is followed by a second IO pad; and
   a processor, adapted to compare between a first test result and a second test result, wherein the first test result represents a first state of the first memory element sampled a predefined period after a first provision of the first signal and the second test result represents a second state of the second memory element sampled the predefined period after a second provision of the second signal;
   wherein the tester is adapted to alter the predefined period, and to repeat the first provision of the first signal and the second provision second signal and the comparison of the first test result to the second test result such as to detect a time difference between a first path propagation period and a second path propagation period.

2. The tester according to claim 1, further adapted to alter the predefined period by a fraction of a clock cycle supplied to a path out of the first path and the second path.

3. The tester according to claim 1, wherein the processor is further adapted to detect the time difference in response to a length of a period during which the first test result differs from the second test result.

4. The tester according to claim 1, further adapted to repeat the first provision of first signal and the second provision of the second signal and a detection of the time difference for different ambient conditions.

5. The tester according to claim 1, wherein the signal generator is adapted to provide the first signal to the first path that starts in proximity to the start of the second path.

6. The tester according to claim 1, further adapted to load test information to the integrated circuit, wherein the test information comprises the first and second signals.

7. The tester according to claim 1, wherein the integrated circuit comprises at least a portion of the tester.

8. The tester according to claim 1, further adapted to evaluate an IO pad output difference between a timing of an output of the second signal by the second IO pad and an output of the first signal by the first IO pad in response to: (a) the time difference between the first path propagation period and the second path propagation period, (b) a first IO pad propagation period, and (c) a second IO pad propagation period.

9. The tester according to claim 1 further adapted to measure a first IO pad propagation period, and a second IO pad propagation period.

10. The tester according to claim 1 further adapted to receive the first test result and the second test result from a boundary scan register that comprises the first and second memory elements.

11. A method for testing an integrated circuit, the method comprises:
    providing a first signal to a first path that starts within the integrated circuit and ends at a first memory element that is followed by a first IO pad, and providing a second signal to a second path that starts within the integrated circuit and ends at a second memory element that is followed by a second IO pad;
    comparing between a first test result and a second test result, wherein the first test result represents a first state of the first memory element sampled a predefined period after a first provision of the first signal and the second test result represents a second state of the second memory element sampled the predefined period after a second provision of the second signal;
    altering the predefined period; and
    repeating the stages of providing, comparing and altering until detecting a time difference between a first path propagation period and a second path propagation period.

12. The method according to claim 11, wherein the altering comprises altering the predefined period by a fraction of a clock cycle supplied to a path out of the first path and the second path.

13. The method according to claim 11, wherein the detecting is responsive to a length of a period during which the first test result differs from the second test result.

14. The method according to claim 11, wherein the repeating comprises repeating the providing, comparing, altering, and detecting stages for different ambient conditions.

15. The method according to claim 11, wherein the providing comprises providing the first signal to the first path that starts in proximity to the start of the second path.

16. The method according to claim 11, further comprising loading test information to the integrated circuit prior to the first instance of providing, wherein the test information comprises the first and second signals.

17. The method according to claim 11 wherein the stage of comparing comprises comparing the first test result to the second test result by a tester coupled to the integrated circuit.

18. The method according to claim 11 wherein the detecting comprises detecting the time difference by a tester coupled to the integrated circuit.

19. The method according to claim 11, further comprising evaluating an IO pad output difference between a timing of an output of the second signal by the second IO pad and an output of the first signal by the first IO pad; wherein the evaluating is responsive to: (a) the time difference between the first path propagation period and the second path propagation period, (b) first IO pad propagation period, and (c) second IO pad propagation period.

20. The method according claim 11, further comprising measuring a first IO pad propagation period, and a second IO pad propagation period.

21. A method for testing an integrated circuit, the method comprises:
- providing a first signal to a first path that starts within the integrated circuit and ends at a first memory element that is followed by a first IO pad;
- providing a second signal to a second path that starts within the integrated circuit and ends at a second memory element that is followed by a second IO pad;
- sampling a first state of the first memory element and the first IO pad at a first predefined period after a first provision of the first signal to get a first test result;
- sampling a second state of the second memory element and the second IO pad at the first predefined period after a second provision of the second signal to get a second test result;
- comparing the first test result and the second test result by XORing the first test result with the second test result;
- altering the first predefined period to get a second predefined period;
- providing the first signal to the first path in response to altering the first predefined period;
- providing the second signal to the second path in response to altering the first predefined period;
- sampling a third state of the first memory element and the first IO pad at the second predefined period after a third provision of the first signal to get a third test result;
- sampling a fourth state of the second memory element and the second IO pad at the second predefined period after a fourth provision of the second signal to get a fourth test result; and
- comparing the third test result and the fourth test result by XORing the third test result with the fourth test result.

* * * * *